United States Patent [19]
Fulton

[11] Patent Number: 5,170,089
[45] Date of Patent: Dec. 8, 1992

[54] TWO-AXIS MOTION APPARATUS UTILIZING PIEZOELECTRIC MATERIAL

[75] Inventor: Langdon H. Fulton, Wynnewood, Pa.

[73] Assignee: General Electric Company, Princeton, N.J.

[21] Appl. No.: 453,517

[22] Filed: Dec. 20, 1989

[51] Int. Cl.$^5$ ............................................. H01L 41/08
[52] U.S. Cl. .................................... 310/328; 310/331; 310/366; 359/813; 359/824
[58] Field of Search ................ 310/328, 326, 330–332, 310/345, 366, 333; 360/76, 109; 350/423, 427–430, 245, 247

[56] References Cited

U.S. PATENT DOCUMENTS

| | | | |
|---|---|---|---|
| 2,439,499 | 4/1948 | Williams et al. | 171/327 |
| 3,117,189 | 1/1964 | Kopp | 310/333 X |
| 3,158,762 | 11/1964 | Horan | 310/8.6 |
| 3,219,850 | 11/1965 | Langeuin | 310/333 |
| 3,381,149 | 4/1968 | Wiggins et al. | 310/333 X |
| 4,051,395 | 9/1977 | Taylor | 310/329 |
| 4,099,211 | 7/1978 | Hathaway | 310/332 X |
| 4,113,387 | 9/1978 | Shutt | 356/106 |
| 4,330,730 | 5/1982 | Kurz et al. | 310/331 |
| 4,382,204 | 5/1983 | Yoda | 310/366 |
| 4,475,179 | 10/1984 | Geyer | 365/215 |
| 4,742,260 | 5/1988 | Shimizu et al. | 310/323 |
| 4,906,840 | 3/1990 | Zdeblick et al. | 310/332 X |

Primary Examiner—Mark O. Budd
Attorney, Agent, or Firm—Geoffrey H. Krauss

[57] ABSTRACT

A piezoelectric structure comprising four piezoelectric elements arranged in two rows of two each is cantilevered at one end to a reference structure and coupled at the free end to an object to be moved in two mutually orthogonal directions as a suitable electric field is applied to the various elements of the piezoelectric structure.

17 Claims, 4 Drawing Sheets

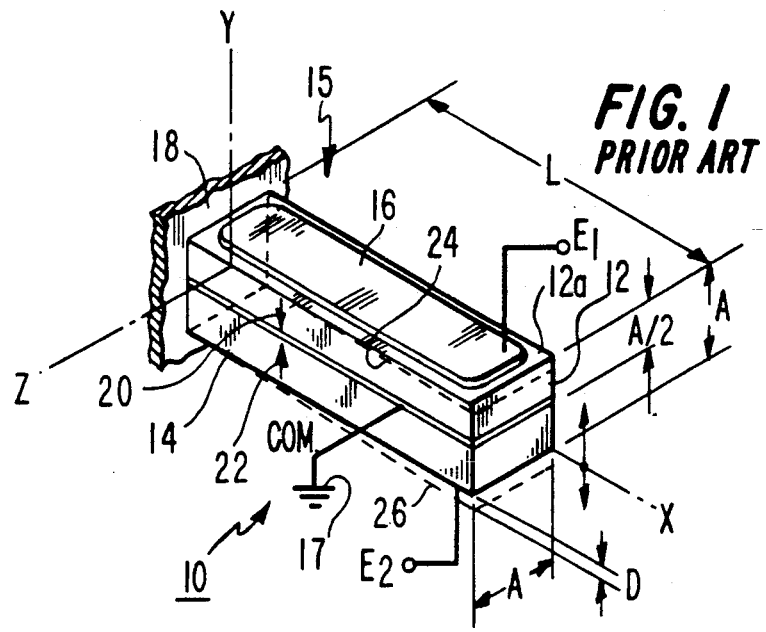
FIG. 1 PRIOR ART
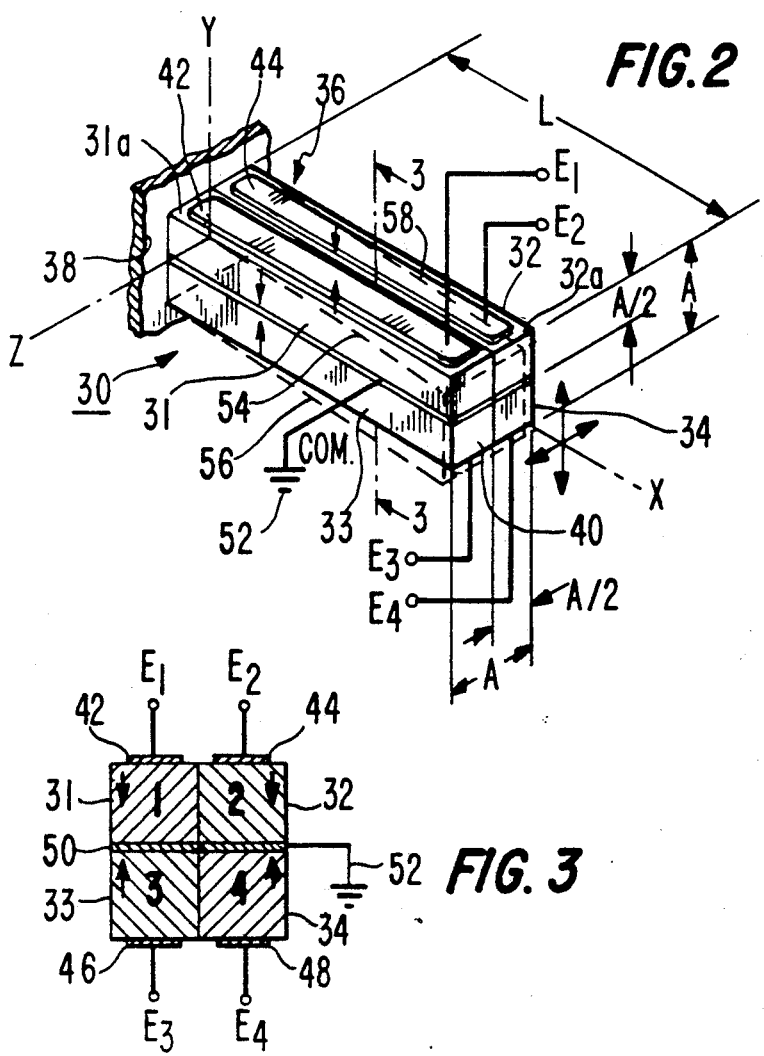
FIG. 2
FIG. 3

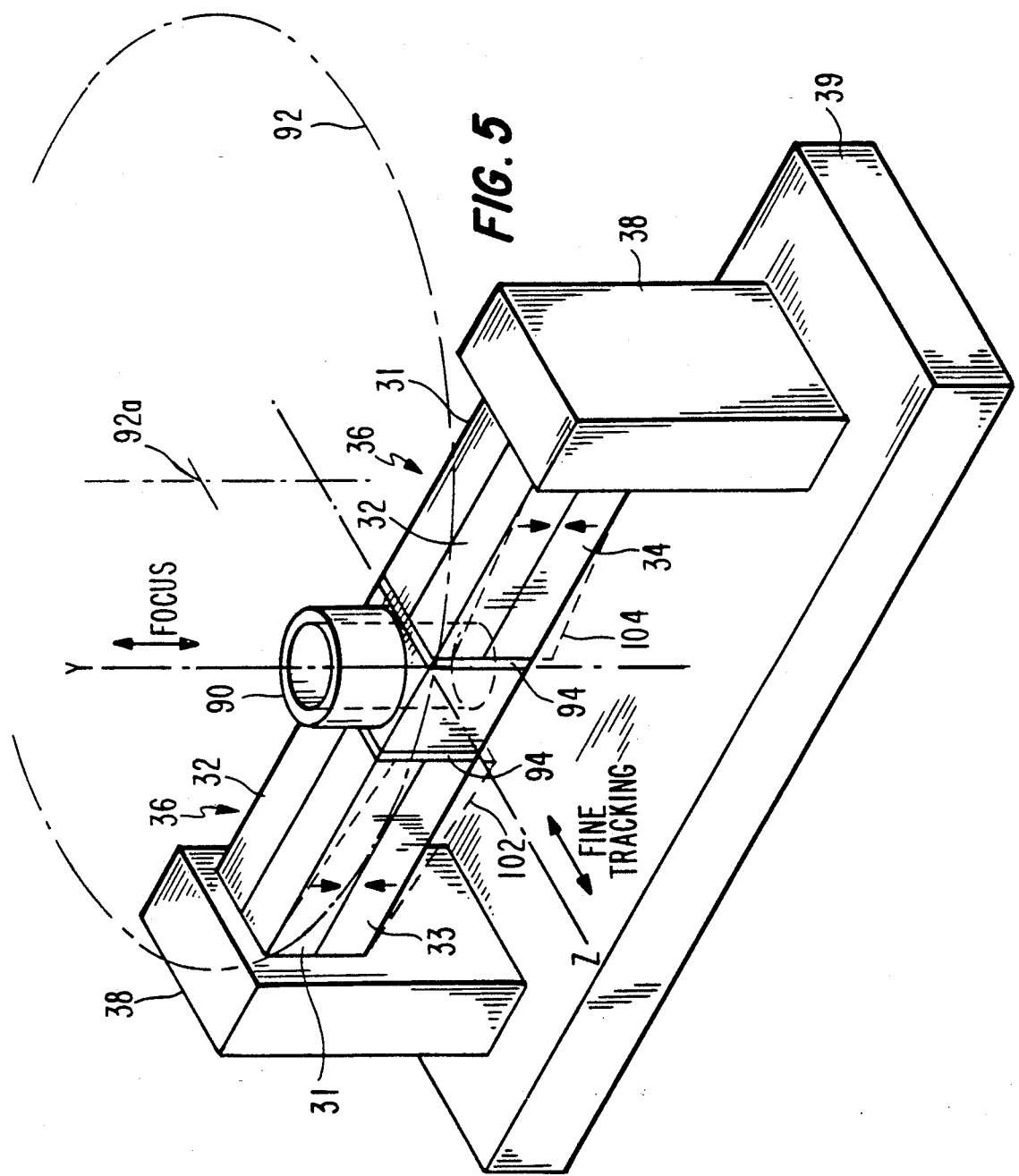

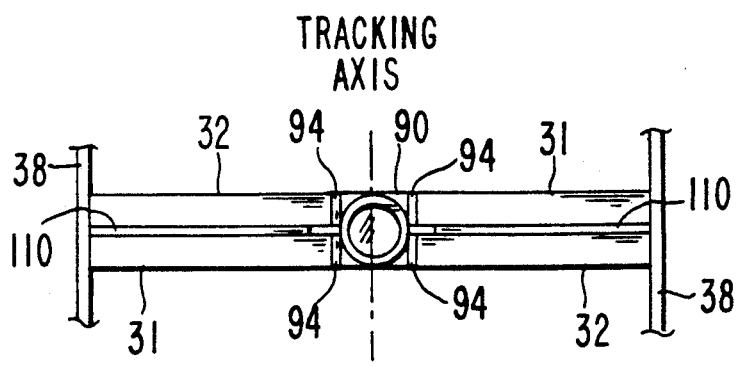
FIG. 6a
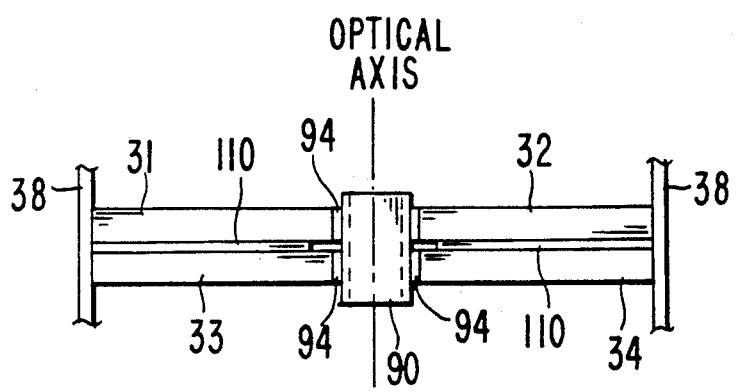
FIG. 6b
FIG. 7
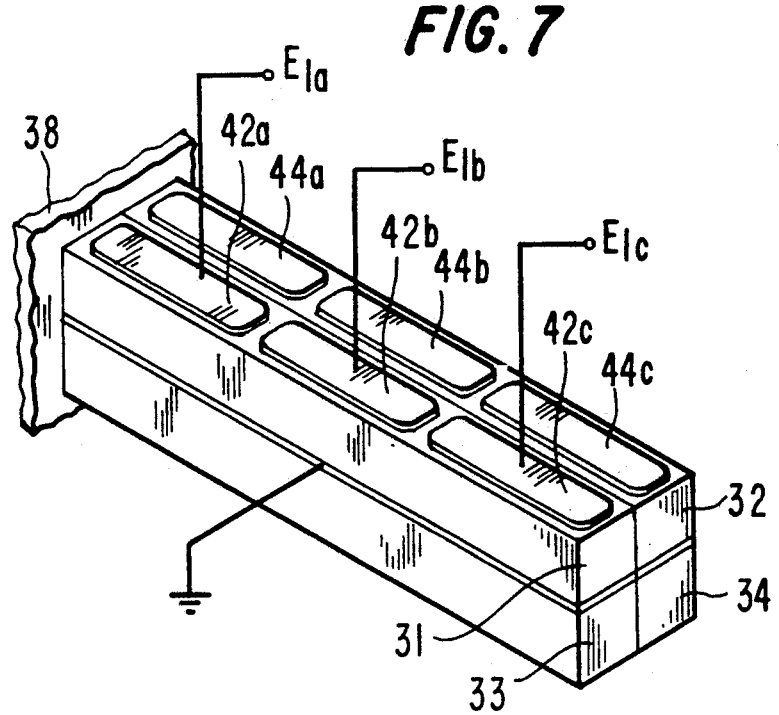

//5,170,089

TWO-AXIS MOTION APPARATUS UTILIZING PIEZOELECTRIC MATERIAL

BACKGROUND OF THE INVENTION

1. Field of Invention

This invention is concerned with apparatus for positioning an object in three-dimensional space and, more particularly, with such an apparatus utilizing multiple piezoelectric elements to create the positioning motion.

2. Description of the Prior Art

There is often a need to move an object with small but controlled motions. For example, it may be necessary to move a lens or light source to read from or write to an optical disk in orthogonal directions toward and away from the disk and along a radial of the disk in opposite directions. It is known to utilize a moving coil actuator to accomplish the aforementioned task. Such actuators utilize delicate and complex mechanisms, including compound spring suspensions, rigid coil assemblies, rare earth permanent magnets, and pole pieces. Such actuators undesirably possess multi-mode mechanical resonances frequently causing instabilities in high performance servo use. Further, the magnetic field present in such actuators may interfere with the magneto-optic properties of the recording and reading of such optical disks.

It is also known to utilize piezoelectric elements for such control as illustrated in U.S. Pat. No. 4,475,179 issued Oct. 2, 1984, and particularly as illustrated in FIG. 2 thereof, which shows a set of four piezoelectric element pairs (bimorphs) for moving an object in the Y directions toward and away from an optical disk and in the X direction radially along the surface of the optical disk. What is not illustrated in FIG. 2 but what must of necessity be present, since the action of a piezoelectric bimorph is to bend, is that there is also motion in directions mutually orthogonal to the illustrated X direction and Y direction thereof, i.e. toward and away from support 52.

SUMMARY OF THE INVENTION

Apparatus for moving an object in two mutually orthogonal directions comprising, in combination, a reference support structure having portions generally facing one another and spaced apart from one another. A first piezoelectric structure comprising first, second, third, and fourth elongated piezoelectric elements is coupled together along the elongated surfaces thereof with one end of each piezoelectric element affixed to one portion with the free end cantilevered therefrom and extending toward the other portion. A second piezoelectric structure identical to the first is cantilevered from the other portion and extends toward the first portion. The free end of the first structure of piezoelectric elements and the free end of the second set of piezoelectric elements are coupled to opposed surfaces of said object.

BRIEF DESCRIPTION OF THE DRAWING

FIG. 1 is a basic bimorph bender structure utilizing a pair of piezoelectric elements in accordance with the prior art;

FIG. 2 is a quadmorph bender structure utilizing two structures of FIG. 1 secured together;

FIG. 3 is a section along lines 3—3 of FIG. 2;

FIG. 5 is a focus-tracking system utilizing two of the structures of FIG. 2;

FIGS. 6a and 6b show an alternative structure to the system of FIG. 5; and

FIG. 7 is an alternative structure to the structure of FIG. 2.

DETAILED DESCRIPTION

Figure 4:
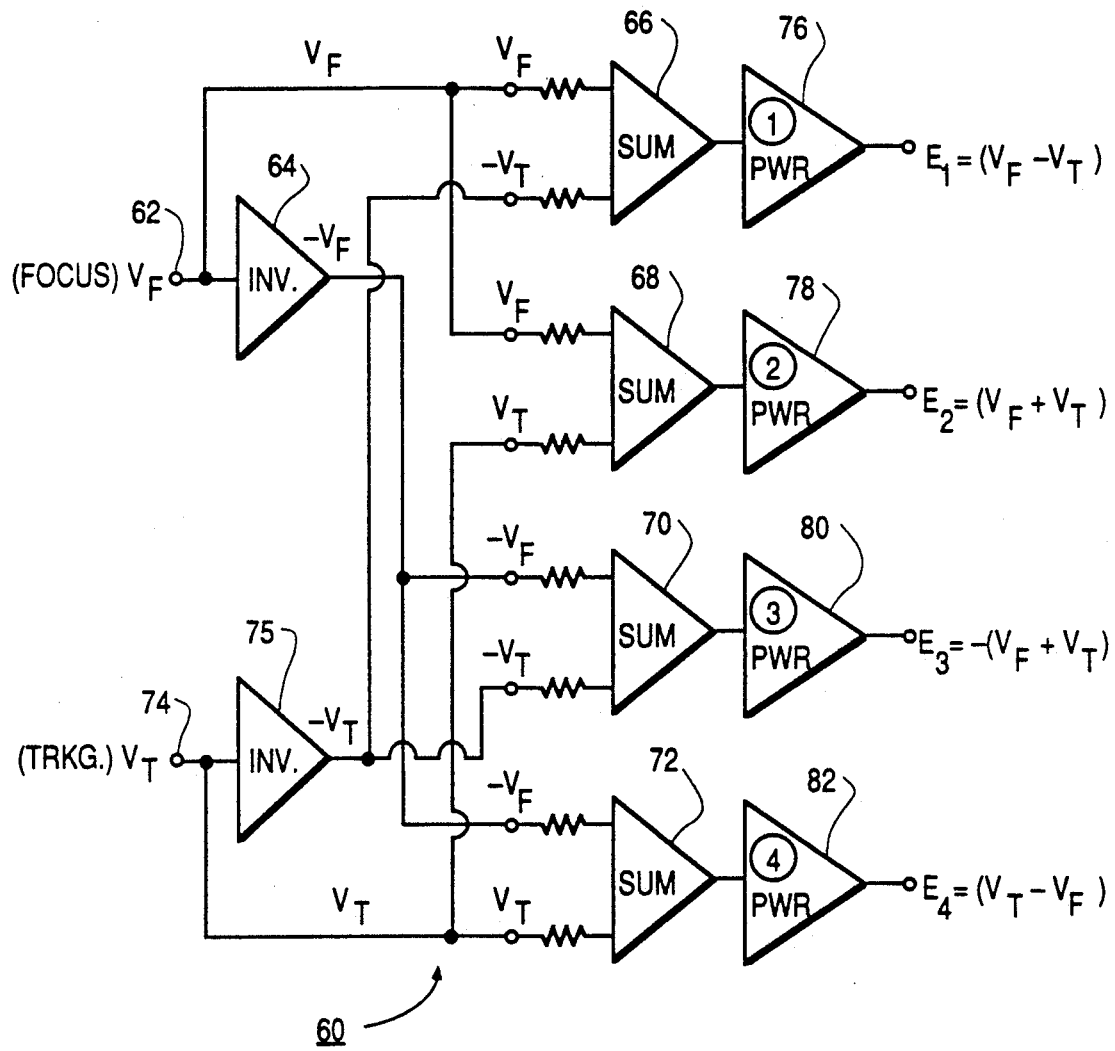
FIG. 4 is a voltage logic circuit for applying a potential to the structure of FIG. 2 to cause it to deflect in two mutually orthogonal directions.

Referring now to FIG. 1, a typical prior art piezoelectric bimorph bender actuator 10 is illustrated. It comprises two elongated piezoelectric elements 12 and 14 forming a bender assembly 15. Each element is of length L, width A, and thickness A/2 where A<L. A typical suitable piezoelectric material has the designation G1195 which is comprised of lead zirconate titanate and is made by several manufacturers. An electrode 16 is secured to the top surface 12a of element 12 and is coupled to a terminal $E_1$. An exemplary electrode material is silver of 0.001 to 0.01 mm thickness secured to the element by, for example, firing in known manner. The lower surface of element 14 (hidden in FIG. 1) also has secured thereto an electrode, similar to electrode 16, coupled to a terminal $E_2$. Elements 12 and 14 are secured together along the surface of length L and width A with a common electrode (again not separately illustrated) interposed therebetween and secured therebetween and connected to a terminal 17 illustrated as a ground symbol.

Typically one end of the assembly 15 of two piezoelectric elements is secured to a rigid structural support illustrated by mechanical ground 18 such that the assembly 15 is cantilevered therefrom.

Typically during manufacture of the piezoelectric elements they are "poled" in one direction. That is, an electric field is applied, e.g. between terminal $E_1$ and the common (ground) electrode with, for example, the more positive potential applied to terminal $E_1$ while the piezoelectric material is heated to its curie temperature. Such poling causes the piezoelectric element to exhibit internal directional stressing directionally, in response to an applied electric field of a given polarity, and resultant elastic deformation (extensions or compressions) when subsequently subjected to an applied electric field.

The direction of deformation will depend upon the polarity of the applied electric field with respect to the (permanent) poled direction of the piezoelectric element. The arrows such as 20 and 22 indicate the direction of poling of each piezoelectric element. Deflection D at the free end is determined by the formula:

$$D = 4d_{31}E \cdot \frac{L^2}{A^2}$$

where
 $E$ = applied potential between terminal 17 and $E_1$ or $E_2$
 $d_{31}$ = the electromechanical constant of the piezoelectric material.

Thus, for example, if a relatively negative voltage is applied to terminal $E_1$ relative to common terminal 17 and a relatively positive voltage is applied to terminal $E_2$ relative to terminal 17, piezoelectric element 12 will tend to expand while piezoelectric element 14 will tend to compress, causing a deflection of the free end piezoelectric element assembly in the direction illustrated by dashed lines 24 and 26. Thus, the free end deflects along the Y axis as illustrated in FIG. 1. Conversely, if the voltages are reversed from those above described, deflection occurs in the opposite direction along the Y axis from that illustrated by dashed lines 24 and 26. Further, if the poling direction of one of elements 12 and 14 is reversed (arrow 20 pointing up, for example) voltage polarity reversal to that element will cause the above-described effect, compression or expansion. The bimorph bender in FIG. 1 operates in a manner analogous to that of a thermostat comprising a bimetallic strip where bending of the bimetallic strip is proportional to ambient temperature.

The principles illustrated in FIG. 1 are applicable to the structure illustrated in FIG. 2 to which attention is now directed. In FIG. 2, which illustrates what will be termed a quadmorph two-axis actuator 30, there are four elongated piezoelectric elements 31, 32, 33, and 34, respectively. Each of the piezoelectric elements 31–34 is of length L, width A/2 and typically height A/2 where L>A. The four piezoelectric elements are secured together along the common surfaces of length L and width or height A/2 to form, by way of example, a square piezoelectric element assembly 36. One end of the assembly, that is, one end of each of elements 31-34 is secured to a rigid structural support illustrated as mechanical ground 38 such that assembly 36 is cantilevered therefrom and has a free end 40.

Electrodes 42 and 44 (similar to electrode 16 in FIG. 1) are secured, such as by firing to the upper surfaces 31a and 32a, respectively, of elements 31 and 32 and are connected to terminals $E_1$ and $E_2$, respectively. Similarly, electrodes 46 and 48 (see FIG. 3 which is a cross-section of FIG. 2 along lines 3—3) are secured to the bottom surfaces of elements 33 and 34 and are connected to terminals $E_3$ and $E_4$, respectively. A common electrode 50 (FIG. 3) is interposed between and secured to the bottom surfaces of elements 31 and 32 and to the top surfaces of elements 33 and 34 and is connected to a terminal 52 illustrated as a ground symbol.

When a relatively negative voltage is applied to terminals $E_1$ and $E_2$ with respect to common terminal 52 and a relatively positive voltage is applied to terminals $E_3$ and $E_4$ with respect to common terminal 52, deflection as described in connection with FIG. 1 occurs as illustrated by dashed lines 54 and 56 in FIG. 2. That is, a deflection occurs in the Y axis as illustrated in FIG. 2. When a relatively negative voltage is applied to terminals $E_2$ and $E_4$ with respect to common terminal 52 and at the same time a relatively positive voltage is applied to terminals $E_1$ and $E_3$ with respect to common terminal 52, a bending occurs in the Z axis as illustrated in FIG. 2 by dashed lines 54 and 58.

FIG. 4 to which attention is now directed illustrates a typical electrical circuit 60 for driving the bender of FIG. 2. Movement along the Y axis will be termed "Focus", while movement along the X axis will be termed "Travel" to be consistent with an application to be described hereinafter. Terminal 62, receptive of voltage $V_F$, is coupled to an inverter 64 and resistively coupled to one input of each of summation amplifiers 66 and 68. The output of inverter 64 is resistively coupled to one input of each of summation amplifiers 70 and 72. Terminal 74, receptive of voltage $V_T$ is coupled directly to an inverter 75 and resistively coupled to a second input of summation amplifiers 68 and 72 while the output of inverter 75 is resistively coupled to a second input of summation amplifiers 66 and 70. The output of amplifiers 66, 68, 70, and 72, respectively, are coupled to the inputs of power amplifiers 76, 78, 80, and 82, respectively.

When a negative voltage is applied to terminal 62 (relative to ground) and no voltage is applied to terminal 74, a negative voltage appears at terminals $E_1$ and $E_2$ while a positive voltage appears at terminals $E_3$ and $E_4$ all with respect to terminal 52 and the bending illustrated in FIG. 2 in the Y direction occurs. Similarly, a negative voltage applied to terminal 74 (relative to ground) and with no voltage applied to terminal 62 results in a negative voltage being applied to terminals $E_2$ and $E_4$ and a positive voltage applied to terminals $E_1$ and $E_3$ all with respect to terminal 52 with resulting motion in the Z axis in FIG. 2.

Naturally positive or negative voltage may be applied to one or both terminals 62 and 74 with resultant motion in the bender of FIG. 2. Thus, for example, if a positive voltage is applied to both terminals 62 and 74, resultant motions occur in assembly 36, FIG. 2, upward in the Y axis and right in the Z axis as illustrated in FIG. 2.

FIG. 5, to which attention is now directed, illustrates a system for moving an object 90, such as a lens, in an optical media read/write apparatus. An optical media such as a disk 92, illustrated in phantom and containing data tracks, is positioned above object 90. For a disk type media there is a rotational axis 92a in a plane (not shown) passing through the illustrated Y and Z axes. Typically, a light source such as a laser would be positioned below object 90 (as illustrated in FIG. 5) but such an arrangement is well known and is not illustrated in FIG. 5. The system of FIG. 5 includes two quadmorph bender structures 36 secured to two mechanical reference structures 38 which are mechanically secured to one another via base support 39 to form one rigid structure. A compliant material 94, that is one which has the ability to deform in tension and compression, is interposed between and secured to each quadmorph assembly 36 and object 90. Material 94 could be a metal spring or it could be a polymer, for example.

As voltages are applied to various ones of terminals $E_1$, $E_2$, $E_3$, $E_4$, and 52, (FIG. 2) bending of the various piezoelectric elements 31, 32, 33, and 34 occurs as described in connection with FIG. 2. An exemplary bending motion is illustrated by dashed lines 102 and 104. As the bending occurs, naturally the end of each assembly 36 nearest to object 90 will have a component of motion toward the respective reference structure 38. However, for equal amounts of bending in the two structures 36, equal motion toward reference structures 38 will occur. Because of the presence of the compliant material 94 between assemblies 36 and object 90, the material 94 will expand and contract and thus object 90 will simply move rectilinearly along only one or both of: the Z axis for tracking along disk 92 toward and away from axis 92a; and along the Y axis for focussing on disk 92. There will be no motion of object 90 toward either reference surface 38 as would naturally occur in the prior art as exemplified by the aforementioned U.S. Pat. No. 4,475,179.

An alternative arrangement to that illustrated in FIG. 5 is illustrated in FIG. 6 to which attention is now directed. FIG. 6 actually consists of two figures; FIG. 6a which is a plan view and FIG. 6b which is an elevation view. The major difference between the apparatus of FIG. 5 and that of FIG. 6 is the addition in FIG. 6 of viscoelastic material 110 between each of the piezoelectric elements 31, 32, 33, and 34 as illustrated in FIGS. 6a and 6b. The film, or sheet of viscoelastic material 110 performs two functions. It forms a permanent adhesive bond at the interfaces with the piezoelectric element surfaces. It exhibits a "viscoelastic" deformation characteristic when stressed in shear between the two piezoelectric element surfaces. Viscoelastic materials furnish a resistance to shear deformation directly proportional to the time rate of application of the applied shear stress (from the relative displacement of the two rigid piezoelectric element surfaces in opposite directions), thus providing regulated "viscous" damping, beneficial to a servo controlled motion system. The viscoelastic film could be virtually any elastomer (rubber) material, suitably bonded at the piezoelectric faces, or, it could be an elastomer-based adhesive. In the absence of the additional material 110, undesired resonances could occur as rapid movement of the object 90 occurs. It should be understood in connection with FIG. 6 (FIGS. 6a and 6b) that the electrodes illustrated in FIGS. 2 and 3 are present but simply not shown for drawing clarity and furthermore that the common electrode in FIG. 6 would be secured to the piezoelectric elements between the material 110 and each piezoelectric element and electrically connected together to form a electrical common terminal. The structure of FIG. 6 could advantageously be used as assemblies 36 in FIG. 5.

FIG. 7, to which attention is now directed, is an alternative embodiment to that illustrated in FIG. 2 and which is useful in the applications of FIGS. 5 and 6. The individual piezoelectric elements 31, 32, 33, and 34 are identical to those illustrated in FIG. 2 as is the mounting to mechanical member 38. Further, although not shown in FIG. 7, the viscoelastic material 110 illustrated in FIG. 6 could be interposed between the various piezoelectric elements. What is different in FIG. 7 relative to FIG. 2 is the substitution of multiple electrodes on each of the piezoelectric elements 31-34 as opposed to the single electrodes for each element such as electrodes 42 and 44 illustrated in FIG. 2. Thus, for example, piezoelectric element 31 has secured to its top surface (as illustrated in FIG. 7) three electrode segments 42a, 42b, and 42c. Similarly, piezoelectric element 32 has secured to its upper face a plurality of electrodes such as 44a, 44b, and 44c. Although not specifically illustrated, the same arrangement of multiple electrodes on the bottom surface of elements 33 and 34 occurs. Each of the electrodes may then be connected to a separate terminal. Thus, for example, electrode 42a may be connected to terminal $E_{1a}$, electrode 42b may be connected to a terminal $E_{1b}$ and electrode 42c may be connected to a terminal $E_{1c}$. Similar remarks apply to the various electrodes 44a, 44b, and 44c and other electrodes connected to piezoelectric elements 33 and 34. The purpose of the arrangement of FIG. 7 is to permit stable operation over a larger frequency range than is possible with an arrangement of only one electrode per piezoelectric element. With a single electrode per element, the bandwidth is on the order of 400 Hz. By way of contrast, with only two electrodes per element, the bandwidth capability is in excess of 20,000 Hz or five times as much. With the arrangement illustrated in FIG. 7, electric fields can be applied to various ones of the terminals to cause bending of the actuator shown in FIG. 7 in a desired shape and at a desired frequency. Thus, for example, it would be possible to apply a voltage to electrodes 42a and 44a and to complementary electrodes (not illustrated) on an equivalent portion of elements 33 and 34 to cause upward bending and to apply voltage to electrode 42b and 44b and to complementary electrodes on elements 33 and 34 to cause downward bending if such action is desired for a particular application.

Exemplary dimensions of a quadmorph actuator are as follows: L=50 mm; A/2 =5.0 mm; maximum excursion in the Y or Z plane=±0.075 mm; thickness of the material such as 94 in FIG. 5 or material 110=1 mm.

The above figures, it should be understood, are exemplary only and can vary considerably depending on the particular application.

What is claimed is:

1. Apparatus for selectivity moving an object in a plane defined by two mutually orthogonal directions comprising, in combination:
   a reference support structure having first and second portions generally facing one another and spaced from one another;
   a first piezoelectric structure comprising first, second, third, and fourth elongated piezoelectric elements coupled together along the elongated surfaces thereof with one end of each piezoelectric element affixed to said first portion, and with a free end of the first structure cantilevered from said first portion and extending along a substantially straight line toward the other portion;
   a second piezoelectric structure identical to the first, and having a free end cantilevered from said second portion and extending along said substantially straight line toward said first portion;
   said free end of the first structure and said free end of said second structure being coupled to opposed surfaces of said object; and
   means adapted to apply an electric field to various ones of said piezoelectric elements to cause desired movement of said object in at least one of said directions.

2. The combination as set forth in claim 1, wherein said first, second, third, and fourth piezoelectric elements of each structure are arranged in first and second rows each of two piezoelectric elements, said first row comprising said first and second elements, said second row comprising said third and fourth elements.

3. The combination as set forth in claim 2, wherein said means adapted to apply said electric field comprises a common electrode coupled to an elongated surface of each of said elements between said first and second rows and comprises electrodes on an elongated surface of each of said elements which is generally opposite said common electrode.

4. The combination as set forth in claim 1, wherein said object comprises a lens.

5. The combination as set forth in claim 4, further including an optical media having information recordable on a surface thereof in tracks and wherein said lens is movable toward and away from said surface and lateral of said tracks thereon.

6. The combination as set forth in claim 4, further including a rotatable optical disk having a rotational axis about which said disk is rotatable and wherein said lens is movable toward and away from a surface of said disk, and toward and away from said rotational axis thereof.

7. The combination as set forth in claim 1, further including a viscoelastic material positioned between said free end of said piezoelectric structures and said object.

8. The combination as set forth in claim 3, further including means interposed between said first and second elements, between said third and fourth elements, between said first and third elements, and between said second and fourth elements for damping motion of said piezoelectric structures during said motion thereof.

9. The combination as set forth in claim 3, wherein said electrode on said elongated surface of at least one of said elements comprises a plurality of electrically separable electrodes.

10. Apparatus for moving a lens in two mutually orthogonal directions comprising, in combination:
   a reference support structure having first and second portions generally facing one another and spaced from one another;
   a first piezoelectric structure comprising first, second, third, and fourth elongated piezoelectric elements coupled together along the elongated surfaces thereof with one end of each piezoelectric element affixed to said first portion, and with a free end of the first structure cantilevered from said first portion and extending toward the second portion;
   a second piezoelectric structure identical to the first, and having one end of each piezoelectric element affixed to said second portion and with a free end of the second piezoelectric structure cantilevered from said second portion and extending toward said first portion;
   said free end of the first piezoelectric structure and said free end of said second piezoelectric structure being coupled to opposed portions of said lens; and
   means adapted to apply an electric field to various ones of said piezoelectric elements to cause desired movement of said lens.

11. The combination as set forth in claim 10, further including an optical media having information recordable on a surface thereof in tracks and wherein said lens is movable toward and away from said surface and lateral of said tracks thereon.

12. The combination as set forth in claim 10, further including a rotatable optical disk having a rotational axis about which said disk is rotatable and wherein said lens is movable toward and away from said rotational axis thereof.

13. The combination as set forth in claim 10, further including a viscoelastic material positioned between said free end of said piezoelectric structures and said lens.

14. The combination as set forth in claim 10, wherein said first, second, third and fourth piezoelectric elements of each structure are arranged in first and second rows each of two piezoelectric elements, said first row comprising said first and second elements, said second row comprising said third and fourth elements.

15. The combination as set forth in claim 14, wherein said means adapted to apply said electric field comprises a common electrode coupled to an elongated surface of each of said elements between said first and second rows and comprises electrodes on an elongated surface of each of said elements which is generally opposite said common electrode.

16. The combination as set forth in claim 15, further including means interposed between said first and second elements, between said third and fourth elements, between said first and third elements, and between said second and fourth elements, for damping motion of said piezoelectric structures during said motion thereof.

17. The combination as set forth in claim 15, wherein said electrode on said elongated surface of at least one of said elements comprises a plurality of electrically separable electrodes.

* * * * *